United States Patent [19]

Harbich

[11] Patent Number: 4,791,596
[45] Date of Patent: Dec. 13, 1988

[54] METHOD OF LINEAR FILTERING

[75] Inventor: Thomas Harbich, Allmersbach im Tal, Fed. Rep. of Germany

[73] Assignee: Ant Nachrichtentechnik GmbH, Backnang, Fed. Rep. of Germany

[21] Appl. No.: 758,810

[22] Filed: Jul. 25, 1985

[30] Foreign Application Priority Data

Jul. 25, 1984 [DE] Fed. Rep. of Germany ....... 3427349

[51] Int. Cl.⁴ .............................. G06F 7/38
[52] U.S. Cl. .............................. 364/724.16
[58] Field of Search .................. 364/724, 736; 375/88; 329/50, 110, 126, 131–132, 135

[56] References Cited

U.S. PATENT DOCUMENTS

| 4,388,693 | 6/1983 | Nakayama | 364/724 |
| 4,423,488 | 12/1983 | Campbell | 364/724 |
| 4,521,866 | 6/1985 | Petit et al. | 364/724 |

FOREIGN PATENT DOCUMENTS 3121444 12/1982 Fed. Rep. of Germany .

OTHER PUBLICATIONS

Tietze et al., "Synchroner Anderungsdetektor", Halbleiterschaltungs-Technik, 1983, p. 258.
Ruopp, "Auswertung Ferquenzmodulierter Signale mit Nulldurchgangsdiskriminatoren", Frequenz, 1978, pp. 227–232.
Samuel D. Stearns, "Nonrecursive Digital Systems", Digital Signal Analysis, (1983), pp. 102–121.

Primary Examiner—Gary V. Harkcom
Assistant Examiner—Tan V. Mai
Attorney, Agent, or Firm—Spencer & Frank

[57] ABSTRACT

A nonrecursive digital filter, particularly for filtering signals wherein identical values frequently occur in succession. The problem of making such a filter fully integratable at low expense is solved in that the time of a change in signal state with respect to a reference point in time is stored, with these points in time being utilized to address a further memory in which the system specific step response of the filter is stored. These step responses are weighted in a computer with the amplitude associated with each change in signal state, and are accumulated with the proper sign so that the accumulated output signal of the computer represents the desired filtered signal.

9 Claims, 5 Drawing Sheets

METHOD OF LINEAR FILTERING

BACKGROUND OF THE INVENTION

The present invention relates to a linear digital filter which is nonrecursive and can thus be characterized by an impulse response of finite length, particularly for filtering signals in which identical values frequently appear in succession. Such signals are produced, for example, by sampling an analog signal having a step function shape.

One field of use for such a filter, for example, is the demodulation of frequency shift keyed signals (FSK modulation) with the aid of a zero crossing discriminator. For each zero crossing of the FSK signal, a rectangular pulse is generated which, in the simplest case, has a given length in time. Steeper static demodulator characteristics are obtained by the use of zero crossing discriminators of a higher order, in which the length of the pulse depends on the time spacing of the the zero passages, as disclosed by Dr. G. Ruopp in "Auswertung frequenzmodulierter Signale mit Nulldurchgangsdiskriminatoren" [Evaluation of Frequency Modulated Signals By Means Of Zero crossing Discriminators", in FREQUENZ [Frequency], Vol. 32, 1978, pages 227-232. The useful signals which can be fed directly to a threshold decider, is obtained by filtering the binary pulse train through a lowpass filter. Using continuous-time filter technology, such lowpass filters are realized in the form of passive LCR filters or active RC filters which have the significant drawback that they frequently are not completely integratable on one semiconductor chip for reasons of tolerance and because of the high resistance and capacitance values required. When sampling systems are used, the not negligible high-frequency spectral components require either a continuous-time prefilter (anti-aliasing filter) or a sufficiently high sampling frequency must be selected. With the presently increasing use of SC filters (switched capacity or filters), offset problems occur due to the analog operation. Moreover, under certain circumstances, the required high sampling rate may not be realizable, particularly when restrictions exist with respect to current consumption, for example, when a modem is fed by the central exchange battery.

If one thinks of using digital filters having a high sampling rate, a nonrecursive filter appears initially to be applicable since in the described case of filtering a binary signal, and in contrast to the recursive filter, "true" multiplication can be avoided and instead it is merely necessary to perform a weighting with 0 or 1. On the other hand, with the conventional type of nonrecursive filter, the transversal filter, as it is described, for example, by Samuel Stearns in Digital Signal Analysis, published by Hayden Book Company, Inc., Rochelle Park, N.J., 1975, Chapter 8, pages 102-120, the number of memory cells, and thus also the number of calculation operations to be performed per unit time, increases proportionally with the product of the sampling frequency and the system specific duration of the impulse response, and quickly reaches unrealistically high values.

SUMMARY OF THE INVENTION

It is therefore an object of the present invention to provide a method of digital nonrecursive filtering for signals in which a sequence of identical sampling values occur frequently, with such filter permitting full integration on one semiconductor chip at low expense.

The above object is accomplished according to the present invention by a method of filtering an input signal by a nonrecursive linear digital filter including the steps of: detecting the amplitude of an input signal; upon the detection of each change in amplitude, setting a counter associated with each respective said change to a starting value and increasing the value by a constant amount at regular time intervals so that the respective counter states represent the time intervals between changes in signal amplitude relative to a reference point in time in units of one clock pulse period; again associating the counters with subsequently occurring changes in amplitude upon reaching a predetermined counter state corresponding to the time duration of the filter system specific impulse response; providing an addressable memory in which the filter system specific step response is stored; utilizing the counter states to address the memory and cause readout of the step response; weighting each read-out step response with the amplitude of the input signal which occurred during the associated change in amplitude; and accumulating each weighted step response with the correct sign in an accumulator, whereby the output signal of the accumulator represents the desired filtered signal. Preferably the input signal is a signal of the type wherein identical amplitude values frequently appear in succession, such as an analog signal with a step function or a binary signal.

According to a feature of the invention, particularly when filtering an analog signal, upon detection of each change in amplitude of the input signal, the associated amplitude value is stored in a further memory, and the associated amplitude values are read out during the step of weighting. According to a further feature of the invention when filtering an input signal which is a binary signal, no memory for the amplitude values need be provided in that each of the two possible signal aplitude states is associated with certain predetermined counters, for example, alternate ones of a sequence of counters or random access memory cells.

DETAILED DESCRIPTION OF THE PREFERRED EMBODIMENTS

The description below will first describe the operation of a filter according to the invention and thereafter describe one preferred specific embodiment of a filter according to the invention.

If the values of the signal to be filtered are marked $e_i$ and the system specific impulse response of the filter is $h_i$, the following applies for every linear digital filter for the values $b_k$ of the output signal at the point in time k under observation:

$$b_k = \sum_{i=1}^{\infty} h_i e_{k-1}. \tag{1}$$

Since nonrecursive filters are FIR filters (finite pulse response filters), $$h_i = 0 \text{ for all values of } i > N. \tag{2}$$

Without restrictions, one can limit oneself to the reference point in time k=0 and, setting $a_i = e_{-1}$ in Equation (1), the following results:

$$b = b_o = \sum_{i=1}^{\infty} h_i a_i. \tag{3}$$

Each circuit representing a nonrecursive linear digital filter must ultimately perform a calculation of Equation (3). A conventional transversal filter performs each addition and each multiplication in Equation (3) from i=1 to i=N. For the stated signals to be filtered in which identical values for $e_i$ appear frequently in succession, the present invention provides that the calculation of b is performed with a circuit of reduced size. The following observation leads to an expression equivalent to Equation (3) on which the method according to the present invention is based.

If it is assumed that the indices corresponding to the points in time at which the signal state changes are marked $q_i$ (per definition $q_0 = 0$) and the associated signal amplitudes following the changes are $s_i$, i.e. the following assumption applies:

$$a_i = a_l = s_i \text{ for } q_{i-1} < l \leq q_i \text{ and for } q_{i-1} < i \leq q_i \tag{4}$$

Figure 1:
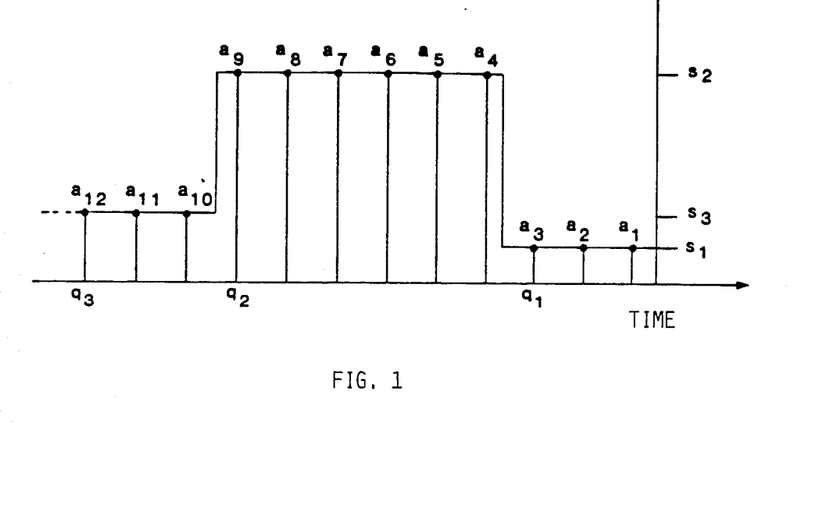
FIG. 1 is an illustration of an analog signal showing the sampling values for the filter and the signal values used for filtering in the method according to the invention.

An exemplary illustration including the analog signal, the sampling values, $a_i$, and the signal values $q_i$ and $s_i$ is shown in FIG. 1.

Describing the input signal as $\{s_i, q_i\}$ instead of by the state vector $\{a_l\}$ obviously indicates a reduction of data if the changes in signal state or value are rare, i.e. in this case the signal is freed from redundancies. Primarily this initially results in reduced memory requirements. However, it is also possible in a simple manner to directly express the output signal b by the reduced data.

Using the step response $$L_n = \sum_{l=1}^{n} h_l \tag{5}$$

and Equation (4), Equation (3) takes on the following form:

$$b = \sum_{i=1}^{p} s_i (L_{q_i} - L_{q_{i-1}}) \tag{6}$$

$$= \sum_{i=1}^{p-1} L_{q_i} (s_i - s_{i+1}) + s_p.$$

Due to the FIR characteristic (2), summation was performed only to a value p. This value p can be defined by $$q_{p-1} < N \leq q_p. \tag{7}$$

A greater value for p than that which results from relationship (7) can always be selected, since this does not change the results of the summations in Equation (6). The number of calculation operations required by an evaluation of Equation (6) now corresponds to the number of state changes in one time window having the length of the filter impulse response.

Figure 2:
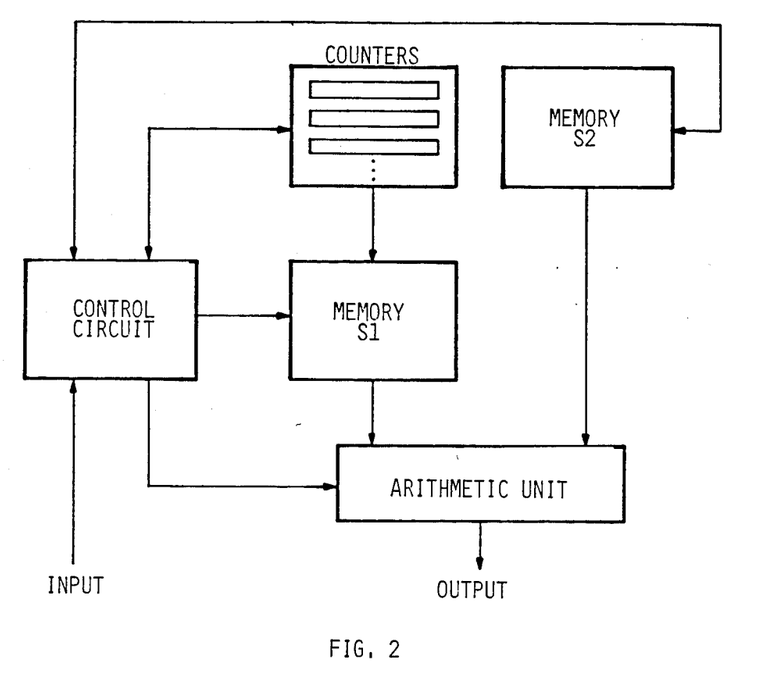
FIG. 2 is a basic block circuit diagram of a nonrecursive linear digital filter according to the invention.

The basic architecture of a nonrecursive filter according to the invention which permits a direct evaluation of the two summations in Equation (6) is shown in FIG. 2.

The filter includes a control circuit to which the input signal is applied and which, in the general case samples the input signal to determine its amplitude and which controls the operation of the various other components. Upon the detection of each change in amplitude or state of the input signal, for example, by a state change detector, the control circuit provides an output control signal to a group of counters to control and cause same to count in a manner to be described below. The counter states are cyclically or simultaneously read out by the control circuit and used as addresss for a memory S1, for example a read-only memory (ROM) in which the filter system specific step response is stored. The control circuit additionally causes the amplitude value of the input signal upon each detected change to be stored in a further memory S2. Connected to the outputs of the memories S1 and S2 is an arithmetic unit for calculating the output signal for the filter. In the arithmetic unit, the filter specific step response read out of the memory S1 as a result of a supplied address corresponding to a respective counter state is weighted with the associated amplitude value read out of memory S2 and accumulated with the proper sign. The accumulated value is then the desired filtered signal.

Figure 3:
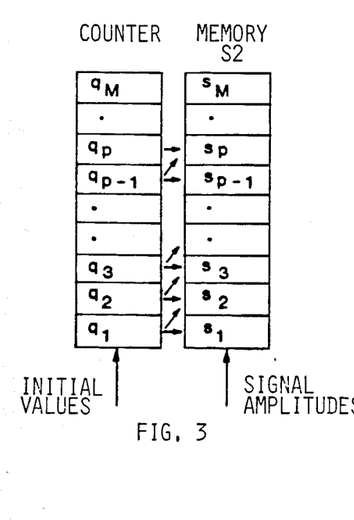
FIGS. 3 and 4 are illustrations indicating two possible arrangements for associating counters or random access memory (RAM) cells and cells of memory S2 with changes in detected amplitude according to the basic concept of the invention.
Figure 4:
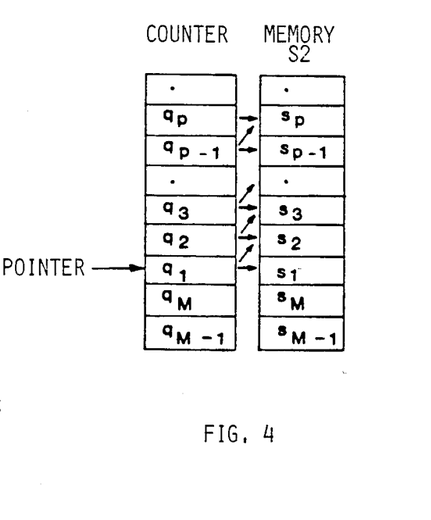

Turning now to the mode of operation of the filter arrangement of FIG. 1, as can be seen from Equation (6), the values $q_i$, i.e. the same spacing of the changes in signal states with respect to the reference point in time, must be available in units of the input clock pulse. It is for this purpose that the plurality of counters is provided. Since, in the final analysis, the values $q_i$ indicate the 'age' of the changes in amplitude or state, all counters must be increased by the same amount between two successive calculations of the output value. Advisably an increase by one is selected, i.e. all counters receive one counting pulse between two calculations. If, after one value of the input signal has been counted in, a change is detected compared to the preceding value, this event will appropriately be considered in that it is assigned to a counter which is now at its starting value (0 or 1, for example). In the time thereafter, this counter is increased together with the other counters. With ever change in signal state detected by the change detector, the new input value is stored in memory S2. According to condition (7), new changes in signal state can be associated with those counters whose value exceeds $q_p$. Two suitable possibilities of association between the respective counters and the changes in amplitude are available. According to the first possibility as shown in FIG. 3, the plurality of counters can be administered in the manner of a shift register. That is, with every change in signal amplitude or state, all counter states are shifted (upwardly as shown in FIG. 3) and the counter feed thereby (the lowermost counter in FIG. 3) is reset. It is recommended to administer the memory contents of memory S2 in the same manner. According to the second possibility as shown in FIG. 4, instead of shifting all counter states, a pointer, i.e., an auxiliary counter, can be shifted when a change in signal state occurs. The pointer then cyclically traverses the set of counters.

It should be noted that instead of a plurality of counters, a RAM (random access memory) can be used. In such case, processing of the individual memory cells or locations corresponding to the counters is then typically sequential.

To calculate the output value b, the values $q_i$ contained in the respective counters are read out and utilized to address memory S1 in which the step response $L_{qi}$ of the filter system is stored. The calculation of b takes place in the computer or data processing unit according to one of the summations in Equation (6). The multiplicative linkages between $L_{qi}$ and $s_i$, $s_{i+1}$ are indicated by arrows in FIGS. 3 and 4. The accumulation can be stopped if $q_p$ according to relationship (7) is reached. Similarly, the value or number M of the set of counters and the memory depth of the RAM, respectively, must be selected to be sufficiently large. For certain signal types, such as, for example, the binary signal of the zero passage discriminator in the FSK demodulator, M can easily be estimated. If one wishes to let the accumulation run to $q_M$ (perhaps so as to make the control mechanism simple), particular care must be taken not to require any nonrealized addresses for memory S1. This difficulty can be overcome in a simple manner by stopping the upward counter when $q_i = N$ is reached.

The whole process, which is controlled by the control circuit, is now described in detail:

Under the assumption that one output value will be evaluated with each input value (a rarer evaluation is always possible) the process which is described in the following can be realized. The process contains three time steps:

1. Detecting the input signal and checking whether a signal change has occurred or not.
2. If an input signal change has occurred, then the memory S2 and the counter states will be modified. In the case of a realization with shift registers—as described above—all stored values will be shifted upwardly (see FIG. 3) by applying a shift clock and the lowest memory cells are loaded with the starting value of the counter and the new signal state (memory S2). If no change in the input state has occurred, then no change in the contents of the shift register or any other activity will take place in this time step.
3. The output signal will be evaluated from equation (6) and all counter states will be incremented. At the end of step 3, step 1 will follow again. In principle, it is only a question of hardware expense and the required speed whether the evaluation of the output signal in step 3 is done sequentially or parallely. In the exemplary embodiment comprising shift registers there exists a simple but relatively slow method to evaluate the output signal.

This method uses M-shift clocks, which read out all counter states and signal amplitudes and supply them to the arithmetic unit. In the arithmetic unit the product and sum (index i) will be performed according to the equation (6). The signal amplitudes are shifted back into the memory S2 without changing. The counter states will be incremented first and then they will be stored in the shift register, which corresponds to the set of counters. In this steady process, M-counters will always be used for the evaluation. The number M will be chosen as small as possible according to the knowledge of the input signal. As mentioned above, a greater number of counters than necessary would not lead to difficulties.

If one restricts oneself to binary input signals, it is sufficient to contemplate a data sequence composed of 0 (low) and 1 (high). Correspondingly, values $s_i$ form an alternating sequence of these values. For the calculation of b according to Equation (6), the only thing of significance with respect to signal amplitudes $s_i$ is whether at the reference point in time the signal is in the low or in the high state, i.e., the value of $s_1$. From Equation (6) the following is derived:

$$b = \Sigma(L_{qi} - L_{qi-1}) \text{ for } s_1 = 0 \qquad (8a)$$

$$i = 2, 4, 6, \ldots$$

and $$b = \Sigma(L_{qi} - L_{qi-1}) + L_{q1} \text{ for } s_1 = 1 \qquad (8b)$$

$$i = 3, 5, 7, \ldots$$

The weighting with the signal amplitudes obviously does not require "true" multiplication. Accordingly, in the case of a binary input signal, the memory S2 for the signal amplitudes can be omitted and the distinction between Equation (8a) and Equation (8b) can be made by associating the two possible changes in signal state (falling and rising edges) with certain counters or RAM cells. For example, changes from low to high can be given a fixed association with RAM cells having an even address, and changes from high to low can be associated with RAM cells having an odd address.

If the jumps in amplitude of the input signal typically involve a few amplitude quantizing stages or only a single one, it is advisable (particularly if $s_i$ may take on high values) to take advantage of the second representation given in Equation (6) since then the differences $s_i - s_{i+1}$ are small. In such a case, the weighting of the step response with the amplitudes can be effected by multiple addition without incurring major losses of processing speed. A method with which this can be accomplished relatively easily will now be described.

Figure 5:
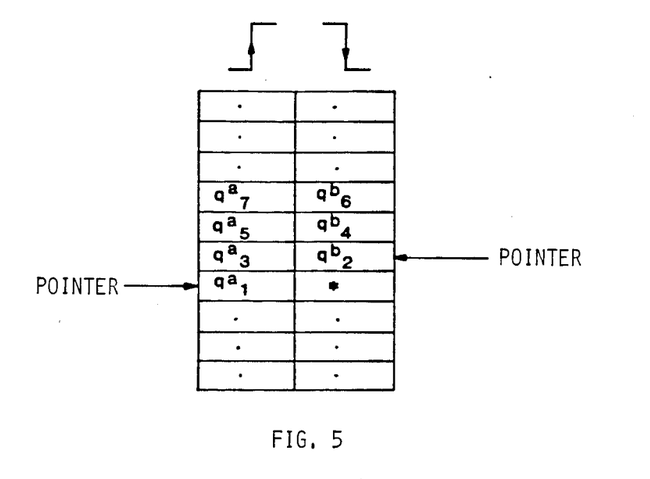
FIG. 5 is an illustration indicating a further arrangement for associating counters or RAM cells with changes in detected amplitude according to a modification of the invention.

To simplify the designations, it is assumed that the values for $q_i$ are stored in a RAM. Half of its memory calls (for example those having an even or odd address) are associated with changes in signal state in the form of an ascending signal and the other half accordingly with changes in the form of a descending signal. The actual occupation position is characterized by a pointer, i.e., a counter, as shown in FIG. 5. At the beginning of signal processing, the respective pointers for the two memory halves point to the beginning of their respective memory region (here indicated as "top"). As soon as a change in signal state occurs, it is determined by how many quantizing stages k and in which direction (ascending or descending) the amplitude jump has occurred. In the associated memory half, k memory cells are then set to the starting value and the corresponding pointer is moved downwardly by k positions. All memory cells preoccupied in this manner must be uniformly incremented between the calculations of the output signals. Every newly occurring change in signal state is processed in this way so that the two pointers shift, according to the signal curve, from the top to the bottom through the address area of the memory halves (in FIG. 5 the written-in times are marked $q^a_i$ and $q^b_i$, respectively, depending on the type of the associated change in signal state).

For a calculation of the filtered signal, the step response is determined (in the manner described above) for each memory cell thus treated. The step responses are accumulated with the correct signal (positive sign for ascending signals, negative sign for descending signals), as indicated in Equation (6). If at the beginning of filtering, the signal was at a value of 0 (which can be assumed to be the case without qualifications), $s_p=0$ due to the summation across all changes in state that have occurred so far. Since the RAM has a finite memory depth, the method functions in this simple form only as long as no pointer has reached the lower end of its memory region. Accordingly, the pointers are set back to the uppermost memory locations when they reach the memory limit and the memory locations are thereafter again associated with changes in signal state as indicated.

In dimensioning the RAM's, care must be taken that sufficient memory depth is available so that no times $q_i$ that may still be needed are erased. Since each newly occupied memory cell, under the assumption of sufficient RAM depth, overwrites the contents of a location which contributes to the filtered signal b with $\pm L_N = \pm 1$ (positive signal for cells belonging to ascending signals), this contribution must still be considered in the final result. For this purpose, an auxiliary counter may be implemented which is appropriately changed with each reoccupation and whose contents are considered in the calculation of the filtered signal b.

Figure 6:
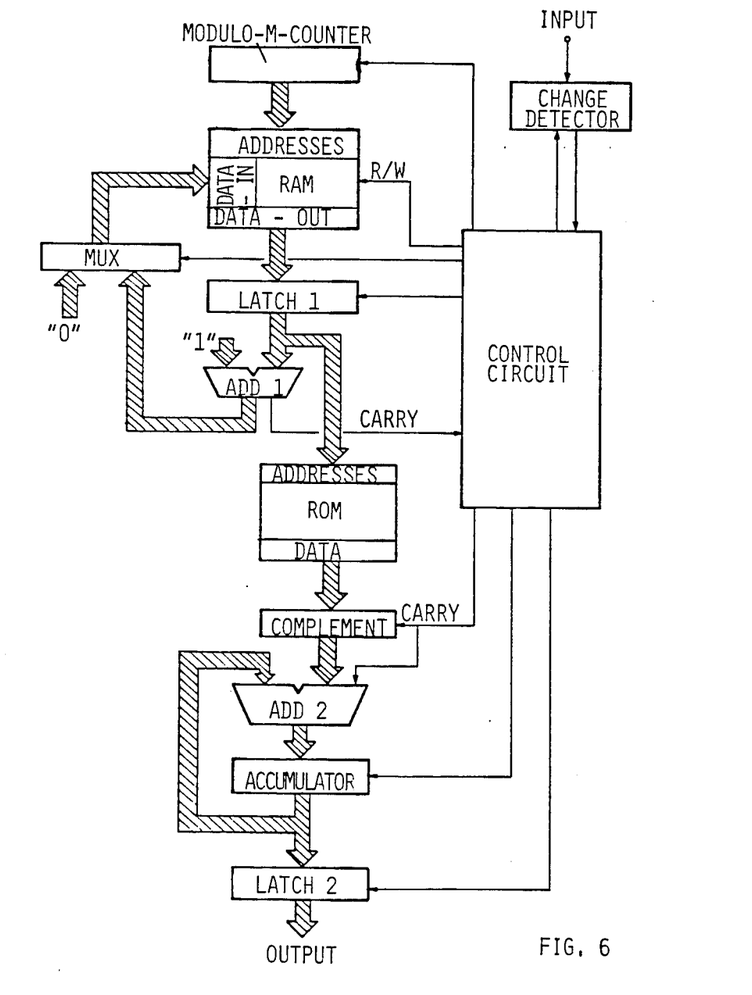
FIGS. 6 and 7 are schematic illustrations of two embodiments of a nonrecursive linear filter according to the invention for filtering a binary input signal.

A detailed description of a nonrecursive linear filter operating according to the method of invention will be described with reference to FIG. 6. It again relates to the filtering of binary signals and is suitable for use in FSK demodulators equipped with zero crossing discriminators. The essential components and their interaction will be described. As shown in FIG. 6, a RAM having a separate output and input is selected as the memory or set of counters for the reduced signal information $q_i$. The memory depth of the RAM is assumed to be M. A counter in the form of a modulo-M counter serves as the addressing means for the RAM. At the beginning of each evaluation of an output value, this counter points at the RAM-cell in which the latest change in the signal state was stored (or alternatively at the RAM-cell in which the next change in the signal state will be stored).

The Administration of the counters is the same as shown in FIG. 4, except for the fact that the memory S2 is no longer needed.

The modulo-M counter takes the function of the pointer shown in FIG. 4 and furthermore it is used for the evaluation of the filter output.

Administration of the data in the RAM and the associated controls are relatively simple if the input signal is processed, and the output signal is calculated, in a fixed clock pulse pattern. Time T is then advisably divided into M+1 time slots of identical length. During the first time slot, the multiplexer (MUX), which supplies the input data to the RAM, can always be switched in such a way that the starting value 0 is present at the data input of the RAM. If the change detector indicates a change in the input signal, the control mechanism provides a clock pulse to the modulo-M-counter to switch the counter to the next RAM address and then a write-in pulse causes the RAM to write in the starting value in the memory cell corresponding to the new address. If there is no change in the input signal, neither counter state nor RAM contents are changed.

Each one of the subsequent M calculation time slots has the same basic structure. At the beginning of each calculation time slot, the counter is switched to the next address so that at the end of the total calculation the counter again has the state it had after the first time slot. In the same time slot, the RAM content corresponding to one previously is read out and stored in a latch (LATCH 1). Now the ROM is read out to provide the step response and the ROM content is added to or subtracted from the content of the accumulator via an adder ADD2. Simultaneously, the value 1 is added to the contents of LATCH 1 in an adder ADD1 and this augmented value is again stored in the RAM. This writing access is prevented by a simple logic when the occurrence of a carry at adder ADD1 indicates that the maximum RAM content, corresponding to the highest valued ROM address, has been reached. In this way the value in the corresponding RAM-cell is saved, i.e. the counter will be stopped. If the RAM-cells contain W-bits, then the adder ADD1 may be built of W-half adders since one of the summands is always 1.

Figure 7:
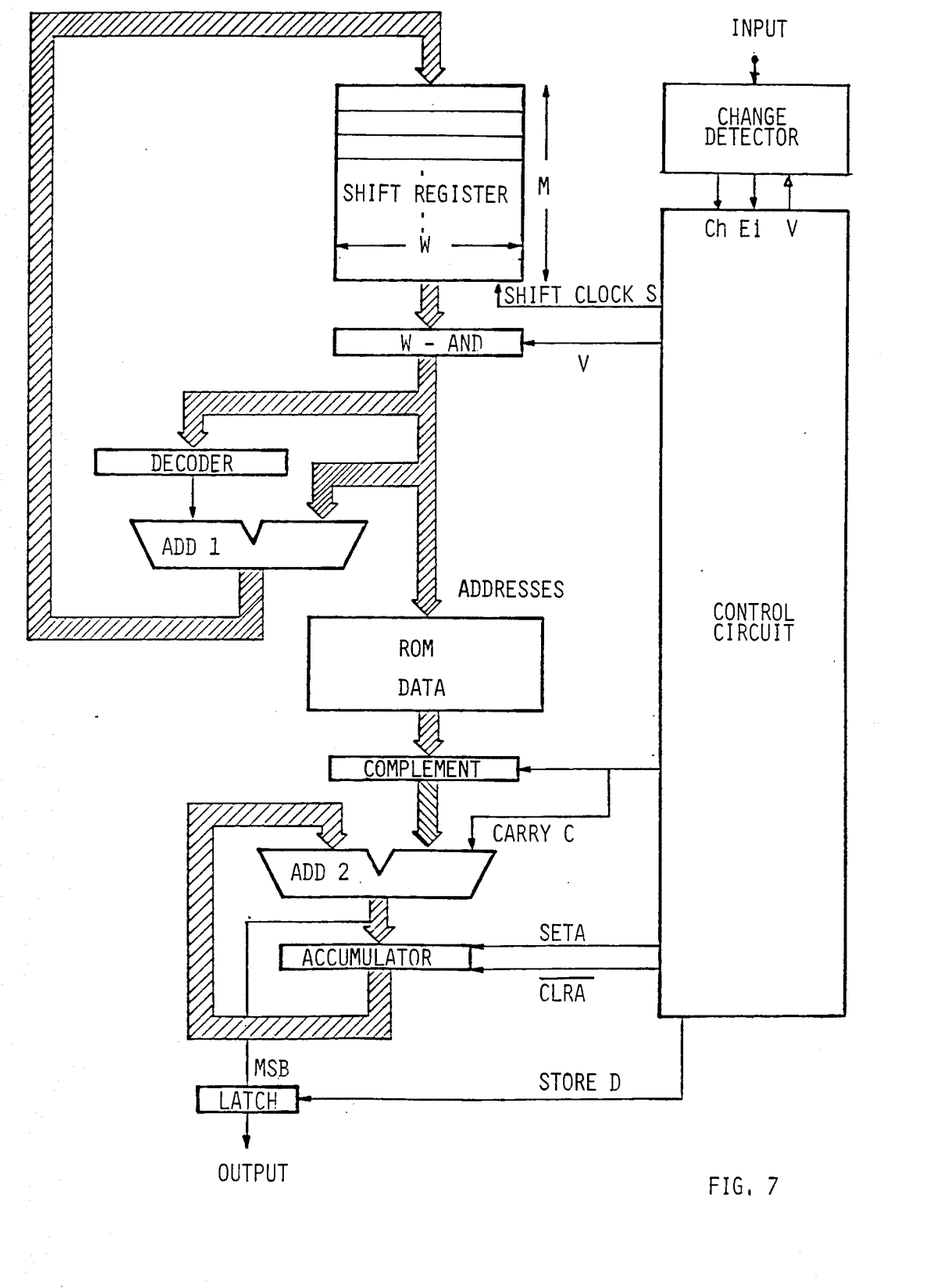
Figure 8:
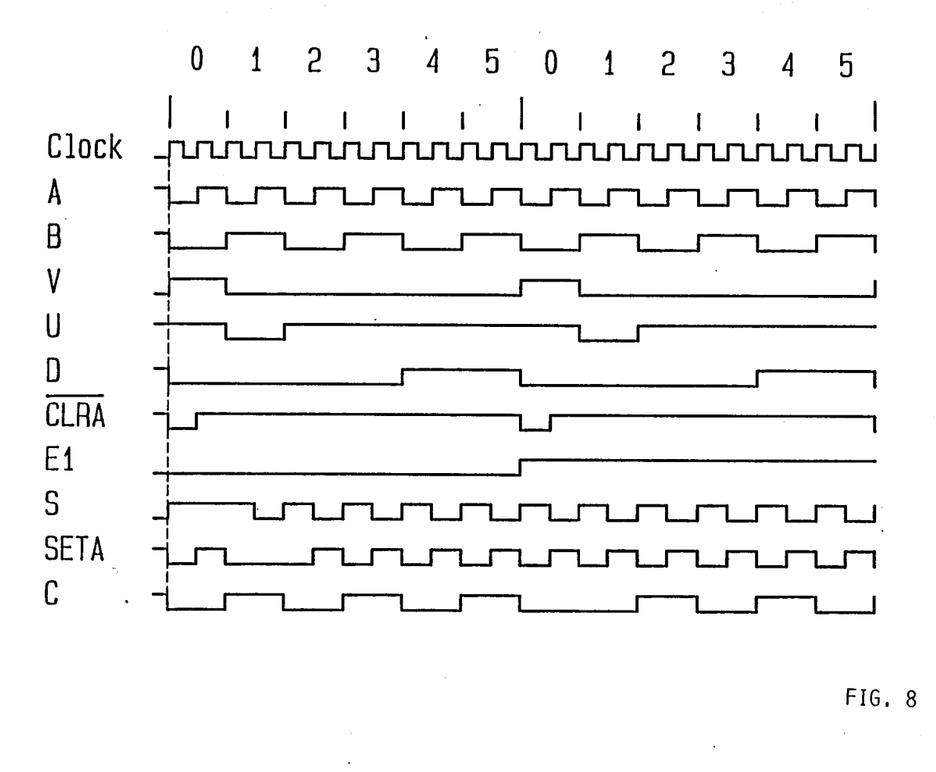
FIG. 8 is a timing diagram according to the embodiment of the linear filter for a binary input signal shown in FIG. 7.

FIG. 7 shows a further embodiment of the filter for binary signals which operates with a counter administration in the form of a shift register. The control circuit is designed similarly to the embodiment of FIG. 6, however, it can be realized in a more simple manner. Therefore, together with the description of the filter according to FIG. 7, a detailed description of the control circuit will be given. FIG. 8 shows a timing diagram of the clock and control signals for two evaluation cycles (sampling two input values E and calculating two output values). As an example, 5 time slots corresponding to the length of the shift register of 5 cells are chosen. Sampling the input signal and detecting possible changes of the input signal E is achieved in the first time slot (denoted by 0 in FIG. 8). This time slot is marked by the auxilary clock V, which is derived from the masterclock (first line in FIG. 8) as all other auxiliary clocks A, B, U, B, CLRA.

During every evaluating time slot (numbered with 1 to 5), exactly one shift clock S occurs. For the whole evaluation time, the AND-gates which follow the shift register (W-AND gates corresponding to the width of the shift register with one input of each AND-gate being connected to the auxilary clock V), are transparent, enabling the information stored in the shift register to address the ROM.

Restoring the information from the shift registers back again is achieved via adder ADD1. Adder ADD1 can be built of W half-adders. The information signals stored in the shift register must be incremented up to the highest ROM-address only. As an alternative to the embodiment shown in FIG. 6 this is realized by a decoder, which will supply a logic 1 to the left input of adder ADD1 until the shift register has reached its maximum counter state. In the case that the maximum counter state is taken, the left input of adder ADD1 is supplied with a logic 0 by said decoder. If the maximum counter state is formed by a binary number equal to $2^W-1$, an AND-gate as a decoder with W inputs will be adequate.

During the first time slot (labeled 0 in FIG. 8), a logic 0 is fed to the adder ADD1 via the AND-gates. If a change in the input signal is detected, an additional shift clock will be applied to the shift register. In this case, the oldest information will be overwritten by the starting value of the counter (in the described logic scheme always the binary value 1), as can be seen in FIG. 8. E1 in FIG. 8 represents a delayed input signal, which is processed in the change detector as a derivation from the input signal E. An exemplary embodiment of such a change detector is published in a book by V. Tietze and C. Schenk, Halbleiterschaltungstechnik, Springer-Verlag, (Berlin, Heidelberg, New York), 1983, page 258. The symbols of this publication correspond to the symbols used in FIG. 7 in the following manner:

$$E=x, CH=y, V=\Phi, E1=Q1.$$

In the first group (in FIG. 8 before the rising of the signal E1, which has the same signal characteristics here) a pulse train is shown referring to the case in which the change detector has detected no change of the input signal. In the second group (after the falling edge of the signal E1) the pulse train is shown after the detection of a change in the input signal.

The shift clock S can be derived from the Signal Ch (see FIG. 8) and from the auxilary clocks according to the equation:

$$S=V\cdot Ch+A$$

Within the time slot 1—before the first summation is performed—the address 0 is applied to the ROM. In the course of the evaluation process of the output signal, however, only higher addresses (higher or equal to the starting value of the counter) occur. Therefore it is recommendable to store the starting value for the summation in this cell and to load it into the accumulator in the first time slot. The arithmetic unit is controlled by the signals C, SETA, CLRA and D. As described above, the accumulation has to begin with a sign depending on the actual signal state. It should be noted that in the exemplary embodiment according FIG. 7, the evaluation begins with the signal change which has been detected first.

According to equations 8a and 8b, the number of the summands has to be considered with regard to the signal state (the signal state "high" leads to an odd number of summands and the signal state "low" to an even number). Since the shift register has a fixed number of memory cells (here 5) the 'oldest' counter is omited in the calculation when the signal E1 is low. Therefore for E1=low, the output signal of the adder ADD2 will not be transfered into the accumulator after the first evaluating time slot. In FIG. 8 an embodiment is shown in which the loading of the accumulator is achieved in the falling edge of the signal SETA.

The controlling signal SETA can be derived by the auxiliary clock pulses and the signal E1 according to the following equation:

$$SETA=A\cdot(E1+U).$$

There are other possibilities to solve the mentioned problem. For instance the summation can run over all (M) counters and a correction performed thereafter.

Further, it should be noted that the evaluation operations have to be carried out with alternate signs because the rising and falling edges of the input signal are temporarily related to succeeding shift register cells. The sign controlling device has to notice whether the first address shifted out of the shift register relates to a rising or falling edge. This can be seen from the state of the signal E1. The signal C, which feeds the carry to the adder ADD2 and causes the generation of the complement of the step response, can be evaluated according to the following equation:

$$C=(V\cdot E1)\oplus B$$

After performing all the necessary calculations the result is contained in the accumulator and can be loaded into an output latch as shown in FIG. 6.

In FIG. 7 an embodiment is shown in which, in view of the use in FSK-demodulators, only the highest bit value is separately available at the output of the arithmetic unit. The loading of the output latch is achieved by the falling edge of the auxilary clock D as it is likewise done in the accumulator. The control circuit comprises a simple generation of the auxilary clock pulses from the master clock and a simple gate logic according to the logic equations given above. The functional units as shown in FIG. 6 and FIG. 7 may not include further special features and can be implemented in the usual manner.

Addition and subtraction alternate in the accumulator (complementary arithmetic) under control of the compliment circuit connected between the output of the ROM and one input of the adder ADD2. The accumulator is reset depending on the level of the input signal ($s_1=0$ or $s_1=1$) either before the first or before the second calculation time slot. In this way, the calculation is performed according to Equation (8a) or according to Equation (8b). For use in FSK demodulators, the accumulator can also be preoccupied by the negative value of the decision threshold so that at the end only the highest value bit of the filtered signal need be analysed. After all M calculation operations have been performed in the accumulator, the result can be transferred to the output latch (LATCH2). Initializing of the filter (RAM content, counter etc.) is not necessary.

For use of the filter in FSK demodulators, the required memory depth M is derived from the upper characteristic frequency and the time duration of the system specific impulse response.

It will be understood that the above description of the present invention is susceptible to various modifications, changes and adaptations, and the same are intended to be comprehended within the meaning and range of equivalents of the appended claims.

What is claimed is:

1. A method of filtering an input signal by a nonrecursive linear digital filter including the steps of:
   (a) providing an addressable memory in which the filter system specific step response of the filter is stored;
   (b) detecting each change in amplitude of said input signal;
   (c) for each detected change in amplitude, setting one counter of several counters, associated with each respective said change in amplitude, to a starting value and increasing the value by a constant amount at regular time intervals so that the respective counter states represent the time intervals between changes in signal amplitude relative to a reference point in time in units of one clock pulse period;

(d) utilizing said contour states to address said addressable memory and to cause readout of the addressed said step responses;

(e) weighting each read out step response with the amplitude of the input signal associated with the respective changes in amplitude;

(f) accumulating each weighted step response under consideration of its sign in an accumulator, whereby the output signal of the accumulator represents the desired filtered signal; and (g) repeating step (c) by associating those counters which reach a predetermined counter state corresponding to the time duration of the filter system specific impulse response with subsequently occurring changes in amplitude.

2. A method as defined in claim 1 wherein the counters are realized in the form of memory cells of a random access memory.

3. A method as defined in claim 2 wherein: said input signal is a binary signal; and each of the two possible signal amplitude changes is associated with certain predetermined RAM cells.

4. A method as defined in claim 3 wherein each of said two possible amplitude changes is associated with alternate ones of a sequence of RAM cells.

5. A method as defined in claim 1 wherein said input signal is a binary signal; and wherein each of the two possible signal amplitude changes is associated with certain predetermined counters.

6. A method as defined in claim 5 wherein each of said two possible signal amplitude changes is associated with alternate ones of a sequence of counters.

7. A method as defined in claim 1 further comprising:

associating a first set of counters with ascending changes in signal amplitude and associating a second set of counters with descending changes in amplitude;

indicating the actual occupation of the counters of each set by a respective pointer or auxiliary counter;

after detection of a change in amplitude involving k amplitude quantizing steps, carrying out said step of setting in each of k successive counters of the associated set of counters, and shifting the associated pointer in the same sense by k positions; and when reaching the last counter of one of said sets of counters, causing the associated pointer to be set back to the beginning of the associated set of counters to recycle same and provide cyclic operation of said associated set of counters, whereby the output signal results from the accumulation with the proper sign of the step responses belonging to the changes in signal amplitude weighted by the number of associated counters.

8. A method as defined in claim 7 wherein said counters are memory cells of a random access memory; and wherein one of said first and second sets of counters are the memory cells of said random access memory with even addresses and the other of said sets of counters in the memory cells of said random access memory with old addresses.

9. A method as defined in claim 1 wherein said step (d) of utilizing is carried out following each said detected change in amplitude.

* * * * *